US009470773B2

(12) United States Patent
Uehlin et al.

(10) Patent No.: US 9,470,773 B2
(45) Date of Patent: Oct. 18, 2016

(54) METHOD FOR OPERATING AN ABSOLUTE, OR RELATIVE, PRESSURE SENSOR HAVING A CAPACITIVE TRANSDUCER

(75) Inventors: Thomas Uehlin, Schopfheim (DE); Elmar Wosnitza, Freiburg (DE); Igor Getman, Lorrach (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 308 days.

(21) Appl. No.: 14/127,249

(22) PCT Filed: Jun. 1, 2012

(86) PCT No.: PCT/EP2012/060335
§ 371 (c)(1),
(2), (4) Date: Dec. 18, 2013

(87) PCT Pub. No.: WO2013/004438
PCT Pub. Date: Jan. 10, 2013

(65) Prior Publication Data
US 2014/0144206 A1 May 29, 2014

(30) Foreign Application Priority Data
Jul. 1, 2011 (DE) .................. 10 2011 078 557

(51) Int. Cl.
*G01R 35/00* (2006.01)
*G01L 9/00* (2006.01)
*G01L 27/00* (2006.01)
(52) U.S. Cl.
CPC ............. *G01R 35/00* (2013.01); *G01L 9/0072* (2013.01); *G01L 27/007* (2013.01)
(58) Field of Classification Search
None
See application file for complete search history.

(56) References Cited

U.S. PATENT DOCUMENTS 4,257,274 A * 3/1981 Shimada ............... G01L 9/0042
361/283.4
4,479,070 A * 10/1984 Frische ................. G01L 9/0022
310/338

(Continued)

FOREIGN PATENT DOCUMENTS

CN 2080664 U 7/1991
CN 1321243 A 11/2001

(Continued)

OTHER PUBLICATIONS

Sep. 27, 2012 International Search Report, EPO, The Netherlands.

(Continued)

*Primary Examiner* — Hezron E Williams
*Assistant Examiner* — Mark A Shabman
(74) *Attorney, Agent, or Firm* — Bacon & Thomas, PLLC

(57) ABSTRACT

A method for operating a pressure sensor, which includes a measuring membrane, at least one platform and a capacitive transducer having two pressure dependent capacitances between electrodes on the measuring membrane. The measuring membrane divides a volume pressure-tightly into two volume portions, wherein the second volume portion is enclosed in a measuring chamber between the measuring membrane and the platform. A deflection of the measuring membrane depends on a pressure measurement variable p, which is a difference between a first pressure $p_1$ and second pressure $p_2$ in the volume portions. The pressure measurement variable p follows from both capacitances, wherein, for an intact pressure sensor, the second capacitance is a predetermined function of the first capacitance and, in given cases, the temperature. The method has steps as follows: registering value pairs of both capacitances; testing whether the value pairs correspond within a tolerance range to the predetermined function; and determining a change, respectively damage, of the sensor, when this is too long not the case.

14 Claims, 2 Drawing Sheets

(56) References Cited

U.S. PATENT DOCUMENTS

| | | | | |
|---|---|---|---|---|
| 4,565,096 A | * | 1/1986 | Knecht | G01L 13/025 361/283.4 |
| 4,625,560 A | * | 12/1986 | Sanders | G01L 9/0073 331/65 |
| 4,730,496 A | * | 3/1988 | Knecht | G01L 9/0073 361/283.4 |
| 5,836,063 A | | 11/1998 | Hegner et al. | |
| 6,029,524 A | * | 2/2000 | Klauder | G01L 9/0019 73/718 |
| 6,295,875 B1 | | 10/2001 | Frick | |
| 6,532,824 B1 | | 3/2003 | Ueno | |
| 7,137,301 B2 | * | 11/2006 | Grudzien | G01L 9/0072 73/718 |
| 7,150,197 B2 | | 12/2006 | Hegner et al. | |
| 8,099,249 B2 | | 1/2012 | Jacob et al. | |
| 8,393,222 B2 | * | 3/2013 | Crivelli | G01L 9/0052 361/283.4 |
| 2009/0115340 A1 | | 5/2009 | Chen | |
| 2009/0301211 A1 | | 12/2009 | Yoshikawa et al. | |

FOREIGN PATENT DOCUMENTS

| | | |
|---|---|---|
| CN | 1350636 A | 5/2002 |
| CN | 1484008 A | 3/2004 |
| DE | 4107345 A1 | 9/1992 |
| DE | 102007063116 A1 | 7/2009 |
| EP | 0797084 B1 | 9/1997 |
| EP | 1186875 B1 | 3/2002 |
| EP | 1518097 B1 | 3/2005 |
| EP | 2189774 A1 | 5/2010 |
| WO | 2013004438 A1 | 1/2013 |

OTHER PUBLICATIONS

Jul. 4, 2012 German Search Report, German Patent Office, Munich, Germany.

Jan. 16, 2014 English Translation of IPR, WIPO, Geneva, Switzerland.

* cited by examiner

METHOD FOR OPERATING AN ABSOLUTE, OR RELATIVE, PRESSURE SENSOR HAVING A CAPACITIVE TRANSDUCER

TECHNICAL FIELD

The present invention relates to a method for operating an absolute, or relative, pressure sensor having a capacitive transducer.

BACKGROUND DISCUSSION

Such a pressure sensor includes a measuring membrane, or diaphragm, at least one platform and a capacitive transducer having at least a first pressure dependent capacitance and a second pressure dependent capacitance, wherein the measuring membrane divides a volume pressure-tightly into a first volume portion and second volume portion, wherein the second volume portion is enclosed in a measuring chamber between the measuring membrane and the platform, wherein a deflection of the measuring membrane depends on a pressure measurement variable p, which is a difference between a first pressure $p_1$ in the first volume portion and a second pressure $p_2$ in the second volume portion in the measuring chamber, wherein the first capacitance and the second capacitance are measured, in each case, between an electrode on the measuring membrane and a counter electrode having an essentially pressure independent position, wherein a respectively current value of the pressure measurement variable p is ascertained as a function of the first capacitance and of the second capacitance.

The exact relationship between the pressure measurement variable p and the two capacitances depends especially on the positions of the electrodes in relationship to the measuring membrane and the bending characteristic of the measuring membrane. To the extent that these boundary conditions are fixed by the manner of construction, the pressure measurement variable p can be determined as a function of the current measured values of the capacitances and, in given cases, other disturbance variables, such as the temperature. This assumes, however, that the construction dependent characteristics of the pressure sensor, which influence the transfer functions, are sufficiently stable, and that the pressure sensor especially is at least sufficiently in thermal equilibrium that the characteristics do not deviate too much from equilibrium conditions.

Disclosed in the European publication EP 2 189 774 A1 is a method for compensating rapid temperature changes, which rests on features including that for measured values of the measured capacitance $C_p$ (there designated $C_m$) the measured values of the reference capacitance $C_r$ are compared with expected values of the reference capacitance $C_r$, which follow from the measured values of the measured capacitance $C_p$, and wherein a temperature jump is detected, when the measured value of the reference capacitance lies outside a tolerance range around an expected value, and wherein then for the pressure measured value a correction function is ascertained, which specifically should correct the influence of the temperature jump on the pressure measurement value. In the said publication, it is thus taught to interpret changes of the transfer functions as results of temperature jumps and accordingly in the evaluation to compensate the capacitances model-based. Although this approach has its merits, it errs to the extent that a change of the transfer function can also have other causes, for example, a permanent change in, especially damage to, the measuring cell. This thus has the danger that such a change in the measuring cell remains undetected, and, indeed, with the consequence that one thinks a correct pressure measurement is being made, while, in fact, the resulting measured values are completely wrong.

SUMMARY OF THE INVENTION

It is, therefore, an object of the present invention to provide a remedy for this situation.

The object is achieved according to the invention by the method which provides for operating a pressure sensor, wherein the pressure sensor includes a measuring membrane, at least one platform and a capacitive transducer having at least a first pressure dependent capacitance and a second pressure dependent capacitance, wherein the measuring membrane divides a volume pressure-tightly into a first volume portion and second volume portion, wherein the second volume portion is enclosed in a measuring chamber between the measuring membrane and the platform, wherein a deflection of the measuring membrane depends on a pressure measurement variable p, which is a difference between a first pressure $p_1$ in the first volume portion and a second pressure $p_2$ in the second volume portion in the measuring chamber, wherein the first capacitance and the second capacitance are measured, in each case, between an electrode on the measuring membrane and a counter electrode having an essentially pressure independent position, wherein a respectively current value of the pressure measurement variable p is ascertained as a function of the first capacitance and of the second capacitance, and wherein, for an intact pressure sensor in thermal equilibrium, the second capacitance is representable as a predetermined function of the first capacitance and, in given cases, temperature, which method has steps as follows: monitoring whether registered value pairs of the first capacitance and the second capacitance actually correspond within a predetermined tolerance range to the relationship of the predetermined function, and determining a change and/or damage of the sensor, when this is not the case for a time period, which lasts longer than a time limit value.

In a further development of the invention, the time limit value is a predetermined limit value, especially a time constant, or a multiple of this time constant, which describes the reaching of an equilibrium state of the pressure sensor after a temperature jump.

The multiple can be any rational number greater than one, especially a whole number.

In a further development of the invention, the time limit value is a function of the deviation of the values of the first capacitance and the second capacitance from the relationship of the function.

In a further development of the invention, an intact pressure sensor has a first intact operating state and a second intact operating state, wherein, for an intact pressure sensor in the first operating state in thermal equilibrium, the second capacitance is representable as a first predetermined function of the first capacitance and, in given cases, the temperature, wherein, for an intact pressure sensor in the second operating state in thermal equilibrium, the second capacitance is representable as a second predetermined function of the first capacitance and, in given cases, the temperature, wherein the method includes: registering value pairs of the first capacitance and the second capacitance, testing whether the registered value pairs of the first capacitance and the second capacitance actually correspond within a predetermined tolerance range to the relationship of one of the predetermined functions, and determining a change and/or damage of the sensor, when this is not the case for a time period, which lasts longer than a time limit value.

In a further development of the invention, the pressure sensor transfers irreversibly from the first intact operating state into the second operating state.

The predetermined function can accordingly be especially also a selected function of a plurality of functions, each of which corresponds to one of a plurality of defined operating states.

In this case, it is, first of all, checked, whether the sensor is located in the first operating state. If this is not the case, it can be checked, whether the sensor is located in the second operating state. Damage of the sensor is then determined, in case this is not so for a time period, which lasts longer than a time limit value. When, however, it is once detected that the sensor is located in the second operating state, then checking whether the sensor is located in the first state can be omitted.

In a further development of the invention, the capacitive transducer includes a differential capacitor having at least a first capacitor, whose first capacitance has a first transfer function, and a second capacitor, whose second capacitance has a second transfer function, wherein the transfer functions preferably differ in their pressure dependencies. In such case, it is especially desired that the two capacitances are equal, when the pressure measurement variable has the value zero; in this case, frequently the difference of the capacitances $C_1-C_2$ normalized with the capacitance $C_2$ is taken into consideration for determining the pressure measurement variable, thus $p=p((C_1-C_2)/C_2)$.

In a further development of the invention, the differential capacitor includes a circular disk shaped measuring electrode and a capacitance equal, annular reference electrode, which surrounds the measuring electrode, wherein the measuring electrode and the reference electrode are arranged especially on a platform surface facing the measuring membrane, wherein the measuring membrane includes a circular disk shaped membrane electrode, which preferably extends at least out to the outer edge of the annular reference electrode. Correspondingly, the following holds for the pressure measurement variable p:

$$p=p((C_p-C_r)/C_r) \qquad (I),$$

wherein $C_p$ and $C_r$ refer to the capacitances between the measuring electrode and the membrane electrode, respectively between the reference electrode and the membrane electrode.

In a further development of the invention, the sensor includes a ceramic, circular disk shaped measuring membrane and a ceramic circularly plate shaped platform, wherein the measuring membrane is connected pressure-tightly with the platform along a peripheral joint to form the measuring chamber.

In a further development of the invention, the pressure sensor is arranged in a metal housing having a sealed housing opening, through which the measuring membrane is contactable with a media pressure, wherein the housing has an annular sealing surface, which surrounds the housing opening, wherein a sealing ring is clamped between the measuring membrane and the sealing surface, and wherein the pressure sensor is supported on the rear-side of the platform facing away from the measuring membrane with a clamping apparatus, in order to hold the pressure sensor clamped against the sealing ring. Such sealing rings often comprise elastomers, wherein the sealing rings can change their elastic properties irreversibly, when exposed to a high temperature. This can lead to problems as regards the accuracy of measurement based on the resulting decrease of the clamping force. This is described in European Patent No. EP 1 518 097. A smaller clamping force can lead namely equally to a lessening of bending moments, which radially compress or stretch the measuring membrane, when the clamping apparatus is not designed and dimensioned in the manner as disclosed in the referenced European Patent. The compressing or stretching of the measuring membrane influences, however, the effective stiffness of the measuring membrane, wherein a change of these influences effects a systematic measurement error during measurement operation.

The compressing, respectively stretching, of the measuring membrane can especially bring about a differently shaped bend line of the measuring membrane, thus the deflection of the measuring membrane $z(r,p)/z(0,p)$ from the resting position in the presence of a given pressure p. This changed shape of the bend line can be detected, since the functional relationship between the capacitances changes with the bend line, especially when the radial positions of the electrodes defining the capacitances are sufficiently distinguishable, such as is the case, for example, for the earlier described arrangement of a differential capacitor having a central, circular disk shaped electrode and a surrounding, annular electrode of equal capacitance.

The relationship between the pressure and the capacitances $p(c_p, c_r, T)$ and $c_r(c_p, T)$, respectively $c_p(c_r, T)$, can be ascertained, for example, experimentally and/or by simulation for different aged states and a type of sealing ring, respectively for different clamped states of a pressure sensor type with such a sealing ring.

For implementing the method of the invention, the pressure sensor is connected to an operating- and processing circuit, which can comprise especially a microprocessor, which, based on the $c_r(c_p)$, respectively $c_p(c_r)$ or $c_r(c_p, T)$, respectively $c_p(c_r, T)$, ascertains the state of the pressure sensor.

BRIEF DESCRIPTION OF THE DRAWINGS

The invention will now be explained based on the examples of embodiments presented in the drawing, the figures of which show as follows.

DETAILED DISCUSSION IN CONJUNCTION WITH THE DRAWINGS

Figure 1:
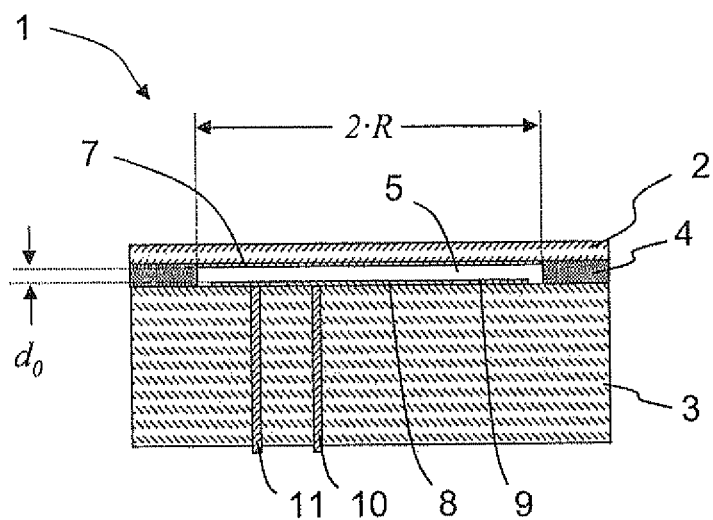
FIG. 1: is a longitudinal section through a capacitive pressure sensor.

The pressure sensor 1 shown in FIG. 1 includes a circular disk shaped, ceramic measuring membrane 2, which is joined pressure-tightly with a significantly stiffer circularly plate shaped, ceramic platform 3 along a peripheral joint 4, in order to form a measuring chamber 5 between the platform 3 and the measuring membrane 2. The measuring membrane and the platform can especially comprise corundum. The joint can comprise especially an active hard solder, or braze, for example, a Zr—Ni—Ti active hard solder, or braze, or it can comprise a glass.

The measuring membrane includes on its platform facing side a full surface, membrane electrode 7, which comprises, for example, a metal layer, especially a Ta layer, wherein the electrode has a diameter of 2 R, wherein R is the radius of the deflectable region of the measuring membrane, which corresponds to the inner radius of the joint. On the surface of the platform facing the measuring membrane, a central, circular disk shaped measuring electrode 8 is arranged, which is contacted by an annular reference electrode 9, which has relative to the membrane electrode 7 in the resting position of the measuring membrane 2 an essentially equal capacitance. The separation of the reference electrode 9 from the measuring electrode 8 and from the joint 4 amounts, in each case, to, for instance, 0.1 R. The reference electrode 9 and the measuring electrode 8 are electrically contacted through the platform via metal cable leads 10, 11. The membrane electrode 7 can be connected, for example, via the joint, to circuit ground.

Figure 2:
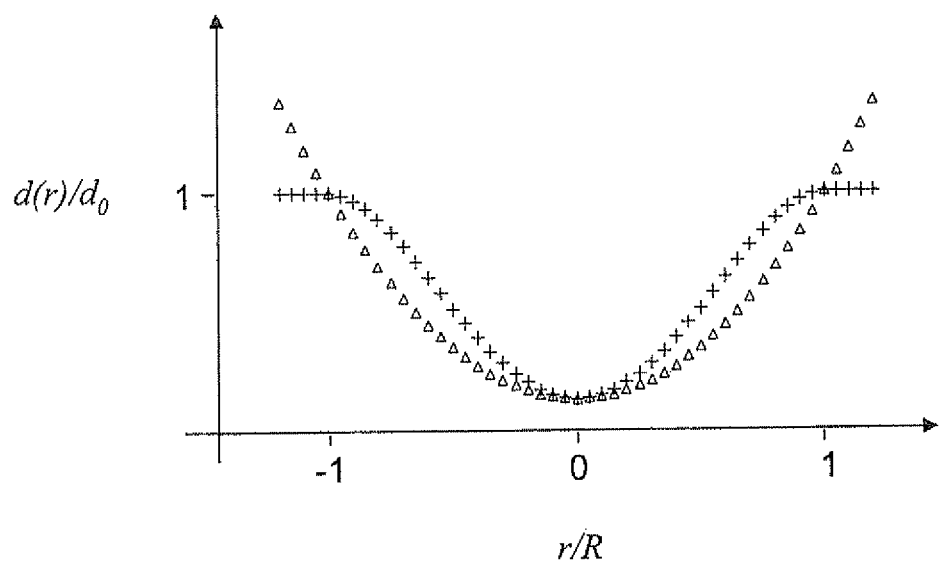
FIG. 2: is ideal bending lines for an edge clamped measuring membrane (+) and for a free measuring membrane (Δ)

The curves illustrated in FIG. 2 show the separation between the measuring membrane and a planar surface of a platform as a function of the radius, in the case of a deflection of the measuring membrane in its center by a half rest spacing $d_0$, and, indeed, for an edge clamped measuring membrane (+) and for a free measuring membrane ($\Delta$). The curves are schematic, and do not correspond exactly with the actual curve, which could be obtained, for example, with FEM simulations in combination with experiments. Actually, knowledge of the exact curve is not essential here, rather the curves should only indicate that, as a function of boundary conditions, such as the clamped situation, the character of the deflection of the measuring membrane can change significantly. Transition of the shape of the edge clamped measuring membrane to the shape of the free measuring membrane can be caused, for example, by a failure of the bond between the measuring membrane and the joint.

Figure 3:
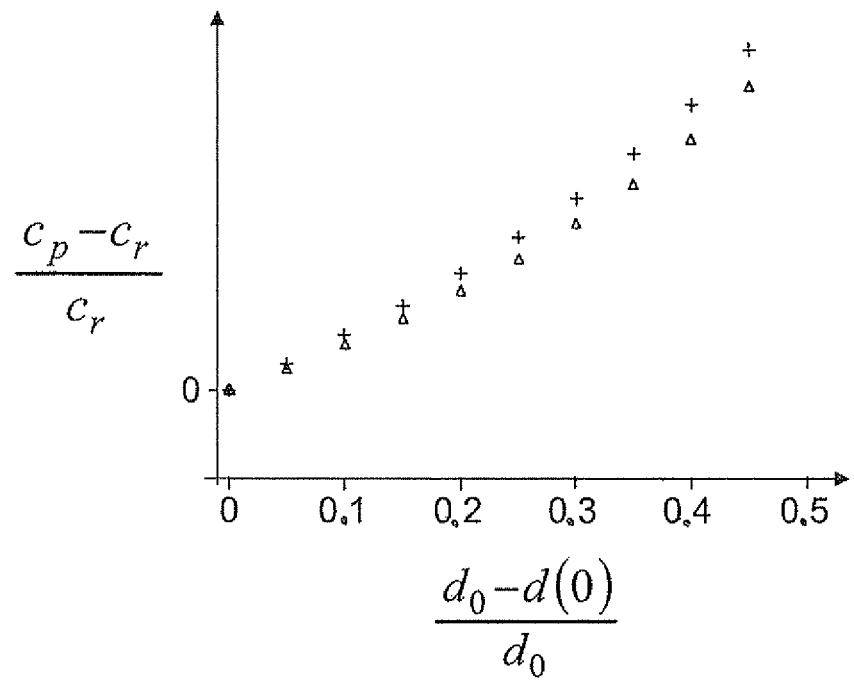
FIG. 3: is the curve of the transfer function $(C_p-C_r)/C_r$ as a function of the deflection of the measuring membrane for a differential capacitor with an edge clamped measuring membrane (+) and with a free measuring membrane (Δ)

The transfer functions $(C_p-C_r)/C_r$ resulting from the different bending lines are shown in FIG. 3 as a function of the deflection of the measuring membrane for the differential capacitor of the pressure sensor of FIG. 1 with an intact bond between the measuring membrane and the joint (+) and after the failure of this bond ($\Delta$). Although the transfer functions show clear deviations from one another and, thus, lead to measurement errors, nevertheless the error is not recognizable based just on the curve of the transfer function.

Figure 4:
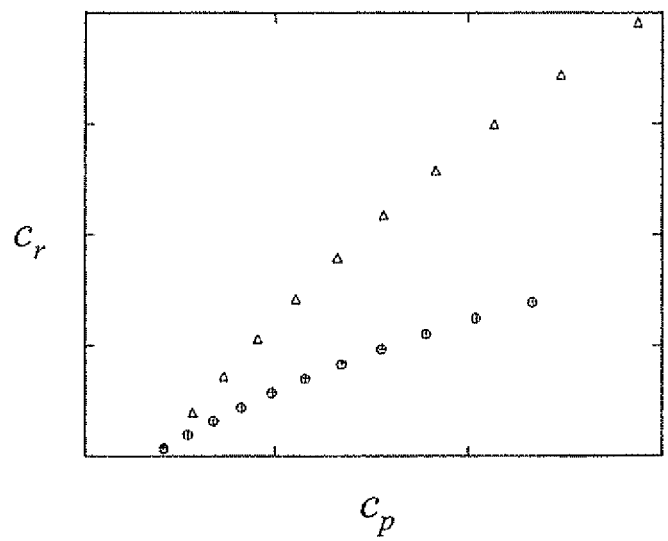
FIG. 4: shows the function $c_r(c_p)$ for the bend line of an edge clamped measuring membrane in the case of reference temperature (+) and in the case of a temperature (○) increased by 100 K, as well as for a free measuring membrane at room temperature (Δ).

A consideration of the function $c_r(c_p)$ illustrated in FIG. 4 enables, however, an unequivocal distinguishing of the individual states of the sensor. The functions $c_r(c_p)$ of an edge clamped measuring membrane in the case of reference temperature (+) and in the case of a temperature (°) increased from the reference temperature by 100 K for a deflection of the measuring membrane by up to the half equilibrium distance differ hardly at all. For an intact measuring cell, thus, in the case of constant conditions, at most, a variation of the functions $c_r(c_p)$ only within a relatively narrow tolerance range is to be expected. The here illustrated curves were determined assuming a bending line of the form, $[1-(r/R)^2]^2$. For a concrete pressure sensor, the actual curve of $c_r(c_p)$, respectively $c_p(c_r)$, over the temperature use range of the pressure sensor should be determined experimentally, in order, on the one hand, to be able to define the function and, on the other hand, to derive a sensible tolerance range. The function $c_r(c_p)$ for the free measuring membrane ($\Delta$), which corresponds to the state after failure of the bond between the joint and the measuring membrane and which here is presented in the case of reference temperature, shows, in contrast, a clearly different curve, which should lie outside all sensible tolerance bands for the function of the intact sensor.

This is where the method of the invention comes in, wherein it is checked, whether measured values for $c_r(c_p)$ correspond to the expected function for an intact pressure sensor. In case this, in the presence of thermal equilibrium of the pressure sensor, is not the case, then a change of the pressure sensor has been detected. This can indicate a transition between intact states or damage of the sensor.

The establishing that current value pairs for the capacitances lie outside a tolerance range of a function $c_r(c_p)$, respectively $c_r(c_p, T)$, can be done with a sufficient certainty comparatively simply.

When, in contrast, based on value pairs of the capacitances, a distinguishing between different defined states of the pressure sensor is to be done, it can be sensible to identify the state of the pressure sensor by means of a statistical analysis based on a large number of value pairs of capacitance values. For this, for example, after an established deviation of the value pairs from a previously valid function $c_r(c_p)$, a number of value pairs $c_r$, $c_p$ can be registered over a sufficiently large value range of $c_p$, in order then, based on a statistical analysis, for example, a regression method, to detect, to which function the value pairs correspond. In case no association with a function corresponding to an intact state of the pressure sensor is possible, then a defect has been detected.

The invention claimed is:

1. A method for operating a pressure sensor, wherein the pressure sensor includes a measuring membrane, at least one platform and a capacitive transducer having at least a first pressure dependent capacitance and a second pressure dependent capacitance, wherein the measuring membrane divides a volume pressure-tightly into a first volume portion and second volume portion, the second volume portion is enclosed in a measuring chamber between the measuring membrane and the platform, a deflection of the measuring membrane depends on a pressure measurement variable p, which is a difference between a first pressure $p_1$ in the first volume portion and a second pressure $p_2$ in the second volume portion in the measuring chamber, the first capacitance and the second capacitance are measured, in each case, between an electrode on the measuring membrane and a counter electrode having an essentially pressure independent position, a respectively current value of the pressure measurement variable p is ascertained as a function of the first capacitance and of the second capacitance, for an intact pressure sensor in thermal equilibrium, the second capacitance is representable as a predetermined function of at least the first capacitance the method comprises the steps of:
registering value pairs of the first capacitance and the second capacitance;
testing whether the registered value pairs of the first capacitance and the second capacitance actually correspond within a predetermined tolerance range to the relationship of the predetermined function; and
determining a change and/or damage of the sensor, when this is not the case for a time period, which lasts longer than a time limit value wherein:
the time limit value is a predetermined limit value, especially a time constant, or a multiple of this time constant, which specifies the time after which an equilibrium state of the pressure sensor after a temperature jump is reached.

2. The method as claimed in claim 1, wherein:
the time limit value is a function of the deviation of the values of the first capacitance and the second capacitance from the relationship of the function.

3. The method as claimed in claim 2, wherein:
the time constant is a monotonically falling function of the deviation.

4. The method as claimed in claim 1, wherein:
an intact pressure sensor has a first intact operating state and at least a second intact operating state;
for an intact pressure sensor in the first operating state in thermal equilibrium, the second capacitance is representable as a first predetermined function of the first capacitance and, in given cases, the temperature;
for an intact pressure sensor in the second operating state in thermal equilibrium, the second capacitance is representable as a second predetermined function of the first capacitance and, in given cases, the temperature;
the method further includes:
testing whether registered values of the first capacitance and the second capacitance actually correspond within a predetermined tolerance range to the relationship of one of the predetermined functions;
in case this is so, ascertaining the pressure measurement variable based on a transfer function, which is associated with the operating state, which corresponds to that predetermined function, whose relationship the registered values of the first and the second capacitance satisfy; and
determining damage of the sensor, in case this is not so for a time period, which lasts longer than a time limit value.

5. The method as claimed in claim 4, wherein:
the pressure sensor transfers irreversibly from the first intact operating state into the second intact operating state.

6. The method as claimed in claim 5, wherein:
the method further includes the steps of:
checking, whether the sensor is located in the first operating state, and when this is not the case;
checking whether the sensor is located in the second operating state; and in case this is not the case for a time period, which lasts longer than a time limit value;
determining that the sensor has been damaged.

7. The method as claimed in claim 1, wherein:
the capacitive transducer includes a differential capacitor having at least a first capacitor, whose first capacitance has a first transfer function, and a second capacitor, whose second capacitance has a second transfer function; and
the transfer functions differ in their pressure dependencies.

8. The method as claimed in claim 7, wherein:
the two capacitances are equal, when the pressure measurement variable has the value zero.

9. The method as claimed in claim 7, wherein:
the differential capacitor comprises a circular disk shaped measuring electrode and an annular reference electrode, especially a capacitance equal, annular reference electrode, which surrounds the measuring electrode;
the measuring electrode and the reference electrode are arranged especially on a platform surface facing the measuring membrane; and
the measuring membrane has a circular disk shaped membrane electrode, which extends preferably at least to the outer edge of the annular reference electrode.

10. The method as claimed in claim 9, wherein:
the pressure measurement variable p is given as:

$$p=p((C_p-C_r)/C_r),$$

wherein $C_p$ refers to the capacitance between the measuring electrode and the membrane electrode, and $C_r$ refers to the capacitance between the reference electrode and the membrane electrode.

11. The method as claimed in claim 1, wherein:
the sensor comprises a ceramic, circular disk shaped measuring membrane and a ceramic circularly plate shaped platform, and wherein the measuring membrane is connected along a peripheral joint pressure-tightly with the platform to form the measuring chamber pressure.

12. The method as claimed in claim 1, wherein:
the pressure sensor is arranged in a metal housing having a sealed housing opening, through which the measuring membrane is contactable with a media pressure;
the housing has an annular sealing surface, which surrounds the housing opening;
a sealing ring is clamped between the measuring membrane and the sealing surface; and
the pressure sensor is supported on the rear-side of the platform facing away from the measuring membrane with a clamping apparatus, in order to hold the pressure sensor clamped against the sealing ring.

13. The method as claimed in claim 12, wherein:
the sealing ring comprises an elastomer;
the sealing ring changes its elastic properties irreversibly, when it is exposed to a temperature, which exceeds a material dependent limit value, whereby clamping forces acting on the measuring membrane and the platform change, whereby the relationship between the capacitances is changed; and
based on value pairs $c_p$, $c_r$, it is ascertained, which function $c_r(c_p)$ is suitable for describing a current relationship between the capacitances.

14. The method as claimed in claim 13, wherein:
based on the ascertained suitable function $c_r(c_p)$, a function $p(c_p, c_r, T)$ is selected for calculating the pressure measurement variable, and a value for the pressure measurement variable is calculated by means of the selected function $p(c_p, c_r, T)$.

* * * * *